United States Patent [19]

Atkinson et al.

[11] Patent Number: 5,003,693
[45] Date of Patent: Apr. 2, 1991

[54] MANUFACTURE OF ELECTRICAL CIRCUITS

[75] Inventors: Anthony Atkinson, Gateshead; Richard Gray, South Shields, both of England; Oscar L. Denes, Greendale, Wis.

[73] Assignee: Allen-Bradley International Limited, Oxfordshire, England

[21] Appl. No.: 443,402

[22] Filed: Sep. 11, 1989

Related U.S. Application Data

[62] Division of Ser. No. 71,267, Jul. 1, 1987, Pat. No. 4,912,288.

[30] Foreign Application Priority Data

Sep. 4, 1985 [GB] United Kingdom ............... 8612116
Sep. 3, 1986 [GB] United Kingdom ............... 8522003

[51] Int. Cl.$^5$ .............................................. H05K 1/00
[52] U.S. Cl. ..................................................... 29/849
[58] Field of Search ................ 29/848, 849; 174/251; 361/401, 402, 414

[56] References Cited

U.S. PATENT DOCUMENTS

| 2,692,190 | 10/1954 | Pritkin .................................. 41/42 |
| 2,972,003 | 2/1961 | Greenman et al. ................. 174/68.5 |
| 3,024,151 | 3/1962 | Robinson ............................ 156/150 |
| 3,039,177 | 6/1962 | Burdett .............................. 29/155.5 |
| 3,077,658 | 2/1963 | Wharton ............................ 29/155.5 |
| 3,161,945 | 12/1964 | Anderson et al. ................. 29/155.5 |
| 3,181,986 | 5/1965 | Pritikin ............................... 156/233 |
| 3,622,384 | 11/1971 | Davey et al. ....................... 117/212 |
| 3,678,577 | 7/1972 | Weglin et al. ......................... 29/625 |
| 4,050,976 | 9/1977 | Reiters ............................... 156/233 |
| 4,301,580 | 11/1981 | Wallace ............................. 29/25.42 |
| 4,369,557 | 1/1983 | Vandebult ......................... 29/25.42 |
| 4,407,685 | 10/1983 | Hankland ........................... 156/212 |
| 4,415,607 | 11/1983 | Denes et al. .......................... 427/96 |
| 4,584,767 | 4/1986 | Gregory ................................ 29/848 |
| 4,710,419 | 12/1987 | Gregory ............................. 428/210 |

FOREIGN PATENT DOCUMENTS

| 0101095 | 2/1984 | European Pat. Off. . |
| 1243746 | 7/1967 | Fed. Rep. of Germany . |
| 656259 | 8/1951 | United Kingdom . |
| 715207 | 9/1954 | United Kingdom . |
| 738265 | 10/1955 | United Kingdom . |
| 822826 | 11/1959 | United Kingdom . |
| 883872 | 12/1961 | United Kingdom . |
| 984250 | 2/1965 | United Kingdom . |
| 1167403 | 10/1969 | United Kingdom . |

*Primary Examiner*—Timothy V. Eley
*Attorney, Agent, or Firm*—Quarles & Brady

[57] ABSTRACT

A method of providing an electrical circuit wherein a carrier, which is a film of insulating plastic material with a circuit pattern thereon is supported in a mould and a moulding material is applied by the application of heat and pressure to provide a substrate so that the circuit is embedded in or within a three-dimensional surface of the moulded substrate.

20 Claims, 3 Drawing Sheets

5,003,693

MANUFACTURE OF ELECTRICAL CIRCUITS

This is a division of application Ser. No. 07/071,267, filed July 1,1987 now U.S. Pat. No. 4912288.

BACKGROUND OF THE INVENTION

This invention relates to the manufacture of electrical circuits formed on a surface of a substance of insulating plastics material Modern, so-called "engineering plastics", are increasingly being used as parts, sub-assemblies or structural members in all kinds of manufactured goods; such as motor cars, aircraft, "white" goods, telecommunications equipment There is often a requirement to incorporate an electrical circuit on such parts and, hitherto, this has been achieved by printing, bonding or otherwise applying the circuit onto the surface of such parts to effectively produce a "printed" circuit on an external surface of a three-dimensional object The printed circuit may include integrally formed resistors, capacitors and inductors and may also have other devices added to the circuit.

Electrical circuits of this kind can only be applied to an external surface of an object, are prone to physical damage and can exhibit the undesirable characteristics of inter-conductor contamination by handling, solder flux residues and accumulated debris, such as dust, in use, which will all reduce the insulation resistance and dielectric properties or give rise to variation in these properties.

U.S. Pat. No. 4,415,607 (Denes et al); assigned to the Assignee of this application, discloses a method of making a printed circuit network device including the steps of depositing an insulating primary substrate layer (a screen printed layer of titanium dioxide loaded epoxy resin dissolved in a combined butyl Cellosolve acetate and n-butanol solvent) on a temporary support structure having a release surface (a super-calendered, clay-coated one side natural kraft paper, coated on the clay side with a silicone release coating), applying to the exposed surface of the primary substrate layer certain defined conductor areas, (screen printed conductive ink using the same epoxy resin based vehicle loaded with a conductive material), mounting the temporary support member with its several layers (together forming a decalcomania) in facing relationship with a permanent support member, and thereafter releasing and removing the temporary support member from the mounted primary support layer.

The sole given application is for the production of printed circuit network devices incorporating resistive paths and, for this, the method additionally comprises the steps of applying defined resistor areas on the exposed surface of the primary substrate layer and in electrical connection with the conductor areas and trimming the respective resistor areas to a predetermined resistive value. An insulating permanent base or support being injection moulded directly to the decalcomania.

SUMMARY OF THE INVENTION

The present invention is an extension and adaptation of the method of the above-identified application with the object of embedding a circuit pattern of electro-conductive or electro-resistive material in or within any surface of a three-dimensionally shaped substrate of insulating plastics material According to the present invention, a method of providing an electrical circuit on a surface of a three-dimensionally shaped substrate of insulating plastics material, comprises the sequential or non-sequential steps of:

(i) providing a carrier, which is a film of insulating plastics material, with a circuit pattern of electro-conductive or electro-resistive, heat-resistant synthetic resin applied to at least one face thereof;
(ii) supporting a face of the carrier;
(iii) forming the patterned carrier into a given three-dimensional shape; and
(iv) moulding, by the application of heat and pressure, a substrate of insulating plastics material against the unsupported face of the carrier;

so that the circuit is embedded in within a three-dimensional surface of the moulded substrate.

Surfaces with embedded circuits produced by this method have the advantages of the circuit being protected against physical damage, improved or constant electrical characteristics (because there is no volume between proud circuit elements to accumulate debris of one form or another).

According to one embodiment of the present invention, a three-dimensionally formed, patterned carrier is inserted in a mould cavity with a face of the carrier supported on a surface of the mould cavity having a shape complementary to that of the formed carrier and the mould cavity is then charged with an insulating thermo-formable plastics material which forms the substrate.

According to another embodiment of the present invention, a moulded substrate, having the circuit embedded in or within surface thereof, is post-formed to a given three-dimensional shape; the circuit material and the substrate material being thermo-plastic.

According to a further embodiment of the present invention, the circuit pattern is applied to one face of the carrier, which face has a release surface for the circuit pattern material, and the carrier is removed from the moulded substrate to leave the circuit embedded in the substrate, flush with a surface thereof With this embodiment there is a high metal density at the exposed surface of electro-conductive circuit parts, thus improving lead connection thereto.

According to yet a further embodiment of the present invention the circuit pattern material, the carrier material and the substrate material are all compatible so that the carrier is bonded with the moulded substrate.

Thus, the circuit may be embedded flush with a surface of the substrate with the carrier as an outer, insulating layer bonded to the carrier surface; or, the carrier may be embedded in the substrate with the circuit embedded in the carrier, the carrier having been deformed during the substrate moulding process to conform to the three-dimensional shape of the circuit and form an effectively flush outer surface with the circuit; or, the carrier may be provided with a circuit pattern on both faces whereby one circuit is embedded in the carrier, substantially flush with the outer surface thereof, and the other circuit is embedded in the substrate beneath the carrier, by choice of dielectric characteristics for the carrier material, the two circuits can combine to form capacitors with through vias provided to interconnect the two circuits, multi-layer assemblies can be built up using this process, an insulating layer having to be provided between each "pair" of circuits;

or, with the moulded substrate and embedded circuit or circuits post-formed to any desired shape, the circuits can be embedded in the inner surfaces of complexly shaped mouldings.

The substrate, with embedded circuit or circuits, can be of any shape capable of being produced by conventional injection moulding processes. Features such as holes or protuberances of any form could be incorporated during the moulding process for fitment of additional pieces to the moulding to form an assembly or a sub-assembly for addition to a higher level assembly. Using either thick and/or thin film technology it is also possible to incorporate conductors, resistors, capacitors, filter networks and inductors to be inlaid in the substrate surface by the method of the present invention.

It is also possible, using the method of the present invention, to produce multi-layer devices by forming alternate, further layers of substrate and circuits; with interconnections between the layers as necessary.

Some advantages given by the present invention are:
single component construction;
the method is solely additive;
robust construction;
and,
heat sinks can readily be incorporated The above and other features of the present invention are illustrated, by way of nonlimiting example, in the Drawings, wherein:

DESCRIPTION OF THE PREFERRED EMBODIMENTS

As shown by FIGS. 1 to 4, a decal 1 consists of a circuit pattern 2 of electro-conductive or electro-resistive ink applied to a face 3 of a thin, flexible film 4 of insulating, thermo-formable material The surface of face 3 is treated or otherwise formed so as to be able to release the circuit pattern 2 and any moulding formed thereon, as described below.

Suitable inks are generally an epoxy resin base vehicle loaded with conductive or resistive material, such as silver powder or ferric oxide; e.g. Heraeus CERMALLOY (Trade Mark) CL80-5231. A suitable carrier material is General Electric ULTEM (Trade Mark) film, thermoplastic polyetherimide. The CERMALLOY ink is screen printed on the ULTEM film and is left uncured; curing being effected by further processing Alternatively, a thermoplastic ink may be employed.

Figure 2:
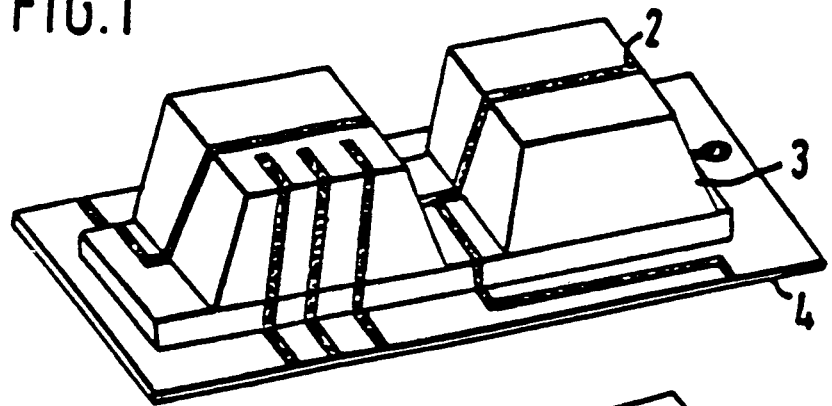
FIG. 2 is a perspective view of the decal of FIG. 1, after moulding.
Figure 3:
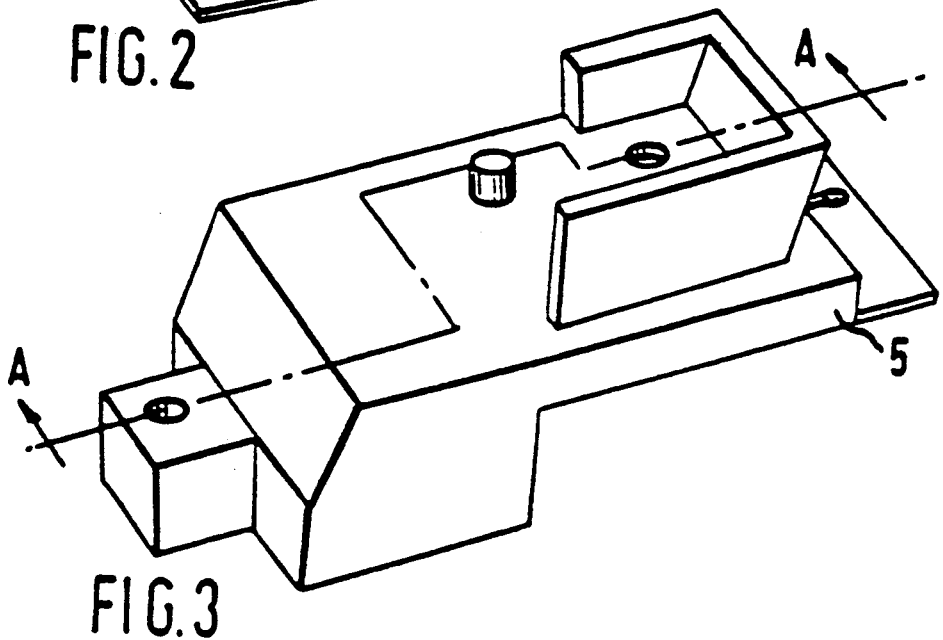
FIG. 3 is a perspective view of a moulded substrate.
Figure 4:
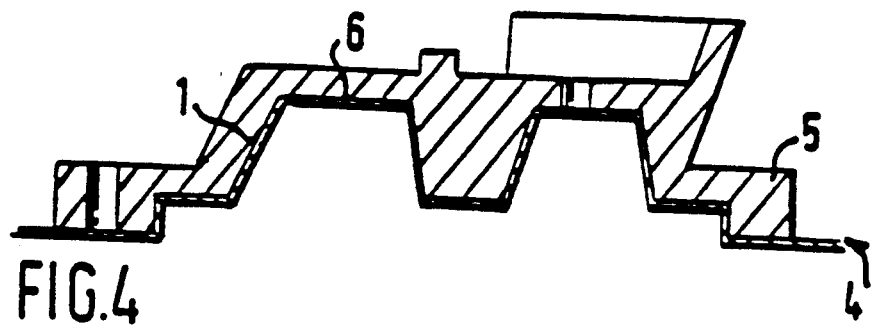
FIG. 4 is a section on the line A-A of FIG. 3, prior to removal of the temporary carrier.
Figure 5:
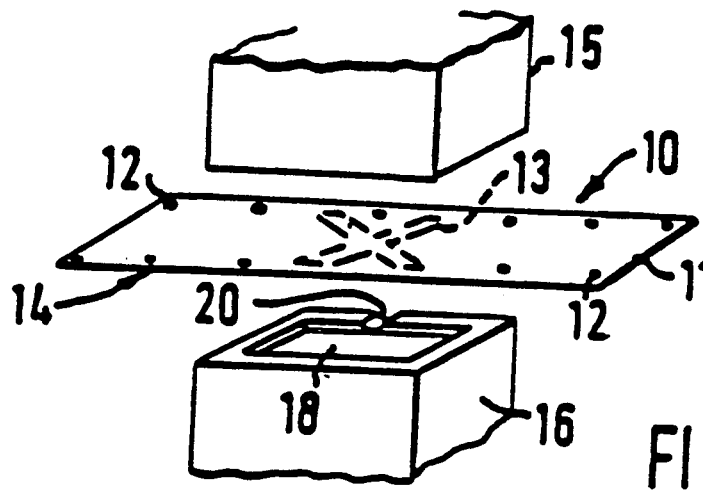
FIG. 5 is a perspective view of a decal prior to insertion in a mould.
Figure 6:
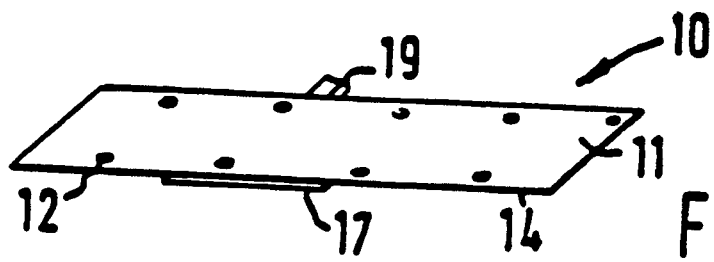
FIG. 6 is a perspective view of the decal of FIG. 5, with a moulded-on substrate.
Figure 7:
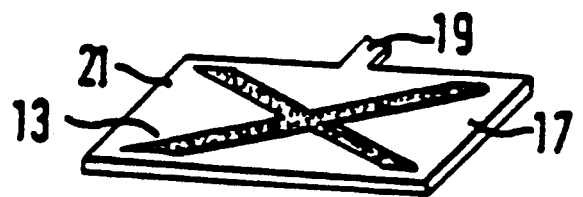
FIG. 7 is a perspective view of the substrate of FIG. 6, with an embedded circuit.
Figure 8:
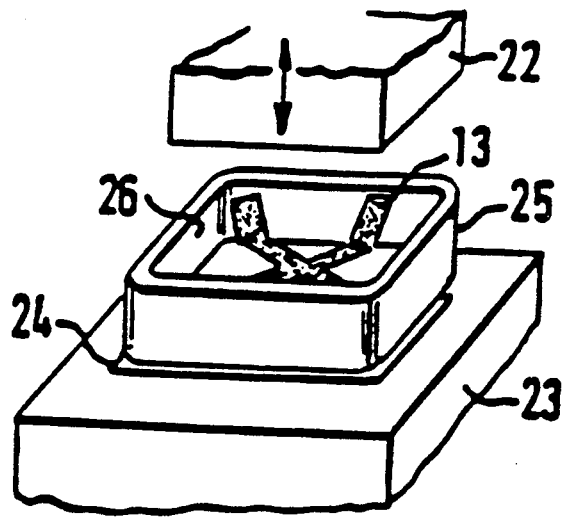
FIG. 8 is a perspective view of the substrate of FIG. 5, after post-forming.

The decal is then formed, by any suitable thermoforming technique, into the shape shown in FIG. 2 The formed decal is mounted on a mould core of complementary shape (not shown), the decal and core are then inserted into a mould cavity and a component having the shape shown in FIG. 3 is then injection moulded onto the formed decal, the core supporting the non-patterned face of the decal during the moulding process; producing the component 5 shown in FIG. 4. Finally, the temporary carrier 3 is stripped from the component moulding 5 to leave the circuit 2 embedded in the inner surface 5 of the component A suitable material for the component is Du Pont RYANITE (Trade Mark) FR 530 NC-10, a 30% glass-reinforced modified PETP, thermo-plastic polyester resin. Alternatively, and as described in more detail below, a non-release surface carrier may be provided and left bonded to the substrate.

FIGS. 5 to 8 illustrate an alternative, continuous manufacturing process wherein a decal 10, generally similar to decal 1 of the above-described embodiment, is employed; this decal 10 being a continuous film 11 with marginal, indexing sprocket holes 12 and a series of circuit patterns 13 printed on the under, release face 14 of the film. For simplicity of illustration, the circuit pattern 13 is shown to be an X, although more complex patterns would, in reality, be employed In this embodiment, a suitable carrier film is Du Pont KAPTON (Trade Mark) film, a thermoset polyimide.

Figure 1:
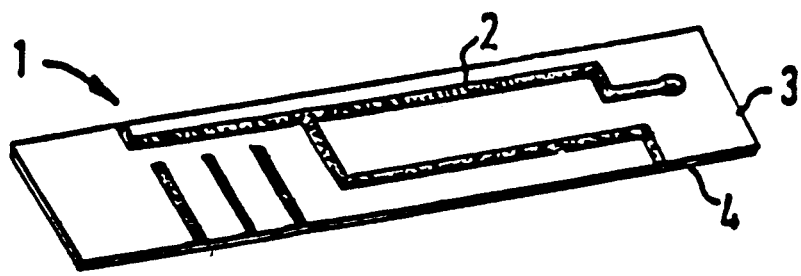
FIG. 1 is a perspective view of a decal.

The decal film is shown in FIG. 1 to be indexed between the top die 15 and the bottom die 16 of an injection mould, wherein a simple rectilinear moulding 17 (FIG. 6) is formed against the underface 14 of the decal by the cavity 18 in the bottom die 16; the flat face (not shown) of the top die 15 supporting the non-patterned face of the decal during the injection moulding process The mould runner 19, formed by the inlet 20 to the mould cavity 18 (FIG. 1) at this stage remaining attached to the moulding 17. The temporary carrier film 11 is then removed to leave the circuit 13 embedded in the moulding, flush with the surface 21 thereof Thereafter the moulding 17 is post-formed to any desired shape by conventional thermo-forming techniques; e.g. hot forming or vacuum moulding (both the circuit material and the moulding material are thermoplastic). In the example illustrated by FIG. 8, the moulding 17 is inserted between a hot internal punch 22, having a rectilinear shape, and a hot die 23, having a cavity 24 of rectilinear shape complementary to that of punch 22 The moulding 17 is formed into an open topped box 25 having the circuit 13 embedded in the internal box surface 26. A suitable material for the moulding 17 again being RYANITE 530-NC-10.

Figure 9:
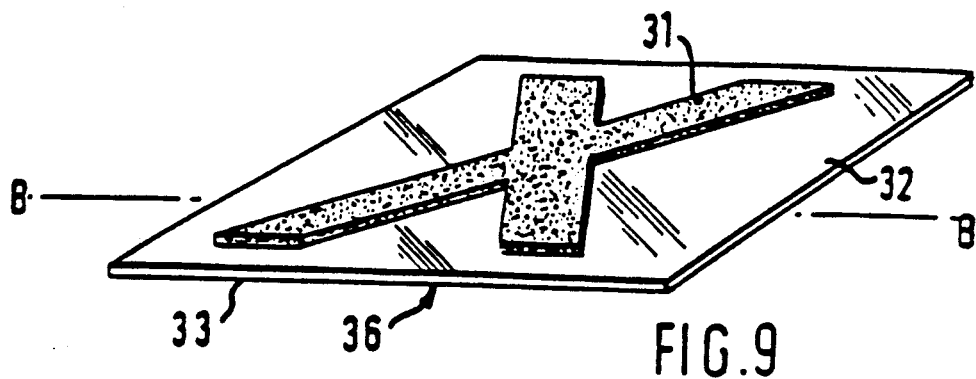
FIG. 9 is a perspective view of a patterned carrier
Figure 10:
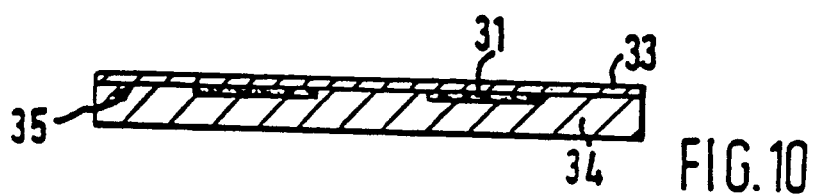
FIG. 10 is a section, on the line B—B of FIG. 9, of a substrate with a circuit embedded "face-down"
Figure 11:
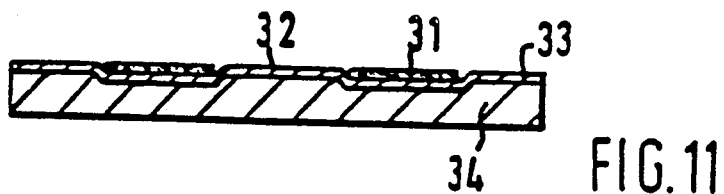
FIG. 11 is a section, on the line B—B of FIG. 9, of a substrate with a circuit embedded "face-up"

As shown by FIG. 9, a circuit pattern 31 of electro-conductive and/or electro-resistive material is applied to one face 32 of a carrier 33 in the form of a thin, flexible film of insulating material Again, CERMALLOY ink is screen printed on to ULTEM film and left uncured Alternatively, a thermo-plastic ink may be employed FIG. 10 shows one embodiment of substrate, with a circuit embedded "face-down", to consist of a carrier 33 with applied circuit pattern 31 and a substrate 34 injection moulded onto the patterned face 32 of the carrier; to leave the circuit 31 embedded flush with the surface 35 of the substrate and the carrier 33 bonded to the substrate surface 35, to form an insulating cover for the circuit and substrate surface The substrate is formed by inserting the patterned carrier in a mould cavity (not shown) with the non-patterned face 36 supported by a surface of the mould cavity, so as to present the patterned face to the interior of the cavity Insulating, thermo-plastic material is then injected into the mould cavity, the heat and pressure of the injection moulding process bonding the injected material to the carrier surface 32 and around the circuit 31 The circuit material, the carrier material and the substrate material all have to be compatible A suitable substrate material, compatible with CERMALLOY ink and ULTEM film, is ULTEM resin, an amorphous thermo-plastic polyetherimide FIG. 11 shows another embodiment of substrate, but with the circuit embedded "face-up", this embodiment is generally similar to the FIG. 10 embodiment but it is produced by inserting the carrier 33 into the mould cavity with the patterned face 32 supported by a surface of the mould cavity, so as to present the non-patterned face 36 to the interior of the cavity During injection moulding the carrier 33 is shaped to conform to the three-dimensional shape of the circuit 31 and the cavity surface so that the circuit becomes embedded in the carrier substantially flush with the outer face thereof; the substrate 34 bonding to the inner face 36 of the carrier.

Figure 12:
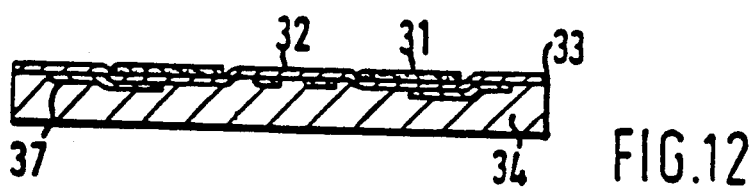
FIG. 12 is a section, on the line B—B of FIG. 9, of a substrate with circuits embedded both "face-down" and "face-up"
Figure 13:
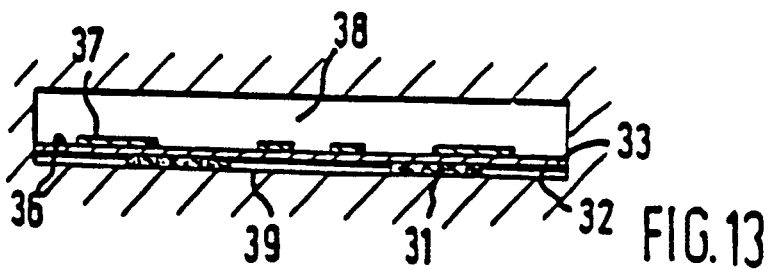
FIG. 13 is a sectional sketch of a patterned carrier inserted in a mould cavity, prior to moulding the substrate of FIG. 12.

FIGS. 12 and 13 show a further embodiment of the substrate, this time having circuits "face-down" and "face-up", wherein the carrier 33 is provided with a circuit pattern 37 on face 36 in addition to the pattern 31 on face 32. The carrier is inserted in the mould cavity 38 with its patterned face 32 supported by cavity surface 39. Resin material is injected into the cavity, as with the FIG. 10 and 11 embodiments, the heat and pressure created during the moulding process three-dimensionally shaping the carrier 33 about circuit 31, to embed circuit 31 substantially flush with the outer face 32 of the carrier and embed circuit 37 in the carrier surface 35, beneath the shaped carrier 33.

Clearly, by providing a compatible insulating interlayer, multi-layered "pairs" of circuits can be built up using this process.

In an alternative, unillustrated moulding process, the embodiments of FIGS. 10, 11 and 12 are produced by providing pre-moulded substrates of thermo-plastic material, laying the patterned carrier onto the substrate surface and applying heat and pressure (such as by a heated roller) to the carrier. Orientation of the patterned face of the carrier relative to the substrate determines whether circuits would be embedded "face-down" or "face-up". This method of moulding lends itself to a continuous process.

Generally, the carrier material has a higher melt temperature than the substrate material when the carrier is to be removed from the moulded substrate and of the same or similar melt temperature when the carrier is to be bonded to the substrate. The inks may be uncured thermo-set resins or thermo-plastic resins.

We claim:

1. A method of providing an electrical circuit in a three-dimensionally shaped surface of insulating plastics material, comprising the sequential or non-sequential steps of:

(i) providing a carrier, which is a film of insulating plastics material, with a circuit pattern of electro-conductive or electro-resistive, heat-resistant synthetic resin applied to at least one face thereof;
    (ii) supporting a face of the carrier;
    (ii) forming the patterned carrier into a given three-dimensional shape; and
    (iv) moulding, by the application of heat and pressure, a substrate of insulating plastics material against the unsupported face of the carrier;

so that the circuit is embedded in a surface of the moulded substrate forming the three-dimensional surface.

2. A method as claimed in claim 1, wherein a three-dimensionally formed, patterned carrier is inserted in a mould cavity with a face of the carrier supported on a surface of the mould cavity having a shape complementary to that of the formed carrier and the mould cavity is then charged with an insulating thermo-formable plastics material which forms the substrate.

3. A method as claimed in claim 2, wherein the circuit pattern material, the carrier material and the substrate material are all compatible so that the carrier is bonded with the moulded substrate.

4. A method as claimed in claim 3, wherein the carrier is inserted in the mould with a patterned face of the carrier constituting at least part of the surface of the mould cavity; to produce a moulded substrate with the circuit embedded flush with a surface thereof.

5. A method as claimed in claim 4, wherein the carrier is bonded to and covers said substrate surface.

6. A method as claimed in claim 1, wherein a moulded substrate, having the circuit embedded in a surface thereof, is post-formed to a given three-dimensional shape; the circuit material and the substrate material being thermo-plastic.

7. A method as claimed in claim 1 wherein the circuit pattern is applied to one face of the carrier, which face has a release surface for the circuit pattern material, and the carrier is removed from the moulded substrate to leave the circuit embedded in the substrate, flush with the surface thereof.

8. A method as claimed in claim 7, wherein, after the carrier has been removed, the moulded substrate is post-formed to a given three-dimensional shape.

9. A method as claimed in claim 1, wherein a moulded substrate of thermo-plastic material is provided, a face of the carrier is applied to a surface of the substrate and heat and pressure are applied between the carrier and the substrate; to produce a moulded substrate with the circuit embedded in the substrate surface.

10. A method as claimed in claim 9, wherein the patterned face of the carrier is applied to the substrate with the circuit embedded in the substrate flush with the surface thereof.

11. A method as claimed in claim 10, wherein the circuit pattern is applied to one face of the carrier, which face has a release surface for the circuit pattern material, and the carrier is removed from the moulded substrate to leave the circuit embedded in the substrate, flush with the surface thereof.

12. A method as claimed in claim 11, wherein, after the carrier has been removed, the moulded substrate is post-formed to a given three-dimensional shape.

13. A method as claimed in claim 10 wherein the carrier is also of thermo-plastic material and the moulded substrate is post-formed to a given three-dimensional shape.

14. A method as claimed in claim 9, wherein the carrier is of a thermo-plastic material and the non-patterned face of the carrier is applied to the substrate surface; to produce a moulded substrate with the circuit embedded in and substantially flush with the carrier face and the carrier shaped about the circuit and embedded in the substrate surface.

15. A method as claimed in claim 14 wherein the moulded substrate is post-formed to a given three-dimensional shape.

16. A method as claimed in claim 9, wherein a circuit pattern is applied to each face of the carrier and either patterned face is applied to the substrate surface; to produce a moulded substrate with one circuit embedded substantially flush with a face of the carrier, the carrier shaped about the circuit and embedded in the substrate surface and the other circuit embedded within the substrate surface beneath the carrier.

17. A method as claimed in claim 16 wherein the carrier is also of thermo-plastic material and the moulded substrate is post-formed to a given three-dimensional shape.

18. A method as claimed in claim 9 wherein the carrier is also of thermo-plastic material and the moulded substrate is post-formed to a given three-dimensional shape.

19. A method for moulding an electrical circuit package wherein a flexible support member is secured to a substrate comprising:
   placing an electrically conductive circuit trace material on one side of a thin flexible film material;
   positioning said flexible film material in a mould; and
   introducing a resinous plastic material into said mould in a manner to fuse with said flexible film material.

20. The method as claimed in claim 19 wherein said mould is of the injection mould type and said resinous plastic is injection moulded against said flexible film.

* * * * *